(12) United States Patent
Iida et al.

(10) Patent No.: US 7,851,058 B2
(45) Date of Patent: Dec. 14, 2010

(54) SHEET FOR SUCTION AND FIXATION, AND METHOD OF PRODUCING THE SAME

(75) Inventors: Hiroyuki Iida, Ibaraki (JP); Junichi Moriyama, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 668 days.

(21) Appl. No.: 11/632,181

(22) PCT Filed: May 31, 2005

(86) PCT No.: PCT/JP2005/009945

§ 371 (c)(1),
(2), (4) Date: Jan. 16, 2007

(87) PCT Pub. No.: WO2006/006314

PCT Pub. Date: Jan. 19, 2006

(65) Prior Publication Data

US 2008/0075935 A1 Mar. 27, 2008

(30) Foreign Application Priority Data

Jul. 13, 2004 (JP) .............................. 2004-206307

(51) Int. Cl.
*B32B 27/14* (2006.01)

(52) U.S. Cl. ................. 428/319.3; 428/319.7; 428/206; 428/315.5; 428/315.7

(58) Field of Classification Search ............... 428/319.3, 428/319.7, 206, 315.5, 315.7
See application file for complete search history.

(56) References Cited

U.S. PATENT DOCUMENTS

2002/0106502 A1* 8/2002 Ambroise et al. ......... 428/308.4
2007/0202298 A1 8/2007 Iida et al.

FOREIGN PATENT DOCUMENTS

| JP | 2-214647 | 9/1993 |
| JP | 5-66855 | 9/1993 |
| JP | 8-258198 | 10/1996 |
| JP | 9-174694 | 7/1997 |

(Continued)

OTHER PUBLICATIONS

Translation of JP 2004-181909, Fukuda et al., "Inkjet Recording Medium, Inkjet Image Forming Method and Inkjet Recorded Matter", Jul. 2, 2004.*

(Continued)

*Primary Examiner*—Hai Vo
(74) *Attorney, Agent, or Firm*—Knobbe Martens Olson & Bear LLP

(57) ABSTRACT

The sheet for suction and fixation according to the invention is a sheet for suction and fixation, constituted by including at least a porous sheet and used for suction and fixation of a member to be sucked, and the sheet for suction and fixation has a structure of a plurality of layers comprising a porous sheet provided on at least one side of the porous sheet with a particle layer constituted by including plastic particles, wherein the surface roughness (Ra) of the particle layer is not greater than 0.5 μm. A sheet for suction and fixation, which is continuous and long and excellent in surface smoothness, and a method of producing the same, can thereby be provided.

8 Claims, 1 Drawing Sheet

FOREIGN PATENT DOCUMENTS

| | | |
|---|---|---|
| JP | 2001-028390 | 1/2001 |
| JP | 2001-172577 | 6/2001 |
| JP | 2001-354796 | 12/2001 |
| JP | 2002-173250 | 6/2002 |
| JP | 2003-27702 | 10/2003 |
| JP | 2003-277702 | 10/2003 |
| JP | 2004-095831 | 3/2004 |
| JP | 2005-235973 | 9/2005 |
| JP | 2006-026981 | 2/2006 |

OTHER PUBLICATIONS

Translation of JP 2002-124237, Yoshii et al., "Separator For Battery and Its Manufacturing Method", Apr. 26, 2002.*

International Search Report issued on the corresponding PCT Application No. PCT/JP2005/009945, dated Oct. 4, 2005.

File History of the related U.S. Appl. No. 11/710,888, as of May 6, 2009.

KR Prior Search Report issued against the corresponding Korean Patent Application No. 10-2006-7022018, dated Jan. 25, 2010.

* cited by examiner

SHEET FOR SUCTION AND FIXATION, AND METHOD OF PRODUCING THE SAME

This application is the U.S. National Phase under 35 U.S.C. §371 of International Application No. PCT/JP2005/009945, filed May 31, 2005, which claims priority to Japanese Patent Application No. 2004-206307, filed Jul. 13, 2004. The International Application was not published in English under PCT Article 21(2).

TECHNICAL FIELD

The present invention relates to a sheet for suction and fixation, which is constituted by including a porous sheet and a method of producing the same and in particular to a sheet for suction and fixation for delivery under suction, fixation under vacuum fixation, etc., in production etc. of glass plates for liquid crystal, semiconductor wafers or laminated ceramic capacitors.

BACKGROUND ART

In the case of an electronic part such as a ceramic capacitor constituted by laminating a dielectric sheet, a plastic porous sheet serving as a sheet for suction and fixation for delivery is used as an additional laminated member for suction and fixation for delivery of the dielectric sheet.

As the porous sheet, a porous sheet consisting of ultrahigh-molecular-weight polyethylene having an average molecular weight of 500,000 or more (referred to hereinafter as "UHMWPE") is proposed to be used in consideration of air permeability, rigidity, and cushioning properties.

Generally, the porous sheet consisting of UHMWPE is produced by charging a mold with UHMWPE and then subjecting it to sintering etc. However, this method constitutes batch production and cannot produce a continuous porous sheet successively.

Accordingly, the applicant has previously proposed a method of producing a continuous porous sheet characterized in that UHMWPE powder filled in a mold is sintered with heated water vapor, then cooled and cut (see, for example, JP-B 5-66855).

The porous sheet obtained by this method is continuous and is thus characterized by being unable in various applications, highly strong, and excellent in air permeability.

The porous sheet produced by this method is about 2.0 μm in surface roughness. This is attributable to cutting conducted in the production process. For example, when a porous sheet is produced using fine particles having an average particle diameter of 30 μm or less, there are problem such as generation of pinholes and formation of cracks during filling and after molding, thus making molding difficult.

As a countermeasure against surface roughness, therefore, there are proposed methods of smoothing a surface by lamination with a plastic film and subsequent heating (see, for example, JP-A 09-174694 and JP-A 2001-28390). These methods can be used to improve surface smoothness. At present, however, there is demand for further improvement of surface smoothness.

As a method of molding small-diameter particles, there is disclosed a method which comprises coating a carrier sheet with a dispersion having plastic particles in a solvent, drying it to form a coating thereon, then fusing contact points of the particles, and releasing the coating from the carrier sheet to give a porous sheet (see, for example, JP-A 2001-172577).

In the method described above, small-diameter particles can be formed into a sheet. The method is applied to cases where the sheet is evidently inferior in strength to a porous sheet produced by cutting. From the viewpoint of the process, the method is more suitable for production of a porous thin sheet than for production of a heavy-gage sheet of greater than 1 mm, for example.

DISCLOSURE OF THE INVENTION

Problems to be Solved by the Invention

This invention was made in view of the problem described above, and the object of this invention is to provide a sheet for suction and fixation, which is excellent in surface smoothness and strength, as well as a method of successively producing such a continuous sheet for suction and fixation which can also be produced as a heavy-gage sheet.

Means for Solving the Problems

The present inventors extensively studied a sheet for suction and fixation and a method of producing the same in order to achieve the above object. As a result, the inventors found that the object can be achieved by adopting the constitution described below, thus arriving at completion of the present invention.

To solve the problem described above, the sheet for suction and fixation according to the present invention is a sheet for suction and fixation, constituted by including at least a porous sheet and used for suction and fixation of a member to be sucked, wherein at least one side of the porous sheet is provided with a particle layer constituted by including plastic particles, and the surface roughness (Ra) of the particle layer is not greater than 0.5 μm.

According to the constitution described above, the sheet for suction and fixation is constituted by forming a particle layer on at least a porous sheet and is thus excellent in strength. The sheet is excellent in surface smoothness because the surface roughness (Ra) of the particle layer is 0.5 μm or less. The particle layer is a layer constituted by including plastic particles and is thus brought, not through surface contact but through multi-point contact, into contact with a member to be sucked. The effective surface area between a member to be sucked and the sucking surface can thereby be reduced to improve the releasability of the suction fixation sheet from the sucked member. As a result, the member to be sucked can, even if it is extremely thin, be prevented from being broken or damaged upon releasing.

The porous sheet is preferably a sintered body composed of ultrahigh-molecular-weight polyethylene.

According to the constitution described above, a porous sheet excellent in abrasion resistance and impact resistance with a low coefficient of friction can be obtained.

For solving the problem described above, the method of producing a sheet for suction and fixation according to the present invention is a method of producing a sheet for suction and fixation, constituted by including at least a porous sheet and used for suction and fixation of a member to be sucked, comprising the steps consisting of preparing a dispersion having plastic particles dispersed in a solvent, applying the dispersion onto a film to form a coating layer thereon, arranging a porous sheet on the coating layer, sintering the coating layer, and removing the solvent contained in the coating layer, to form a particle layer composed of the plastic particles.

According to the method described above, a particle layer constituted by including plastic particles is formed on a porous sheet, and thus a sheet for suction and fixation excellent in releaseability can be produced. In the method described above, a laminated structure having a particle layer formed on a porous sheet is produced, and thus a sheet for suction and fixation, which has higher strength than that of a sheet produced from small particles for example, can be obtained.

As the plastic particles described above, those having an average particle diameter of 100 μm or less are preferably used.

According to the method described above, a particle layer constituted by including plastic particles having an average particle diameter of 100 μm or less is formed, and therefore a sheet for suction and fixation, which is excellent in surface smoothness, can be produced. As a result, the sheet for suction and fixation can, even if a member to be sucked is extremely thin, prevent the member from being broken or damaged upon releasing.

The porous sheet described above is produced by carrying out at least the steps constituting of: of filling ultrahigh-molecular-weight polyethylene powder in a mold and sintering it under predetermined conditions to form a block-shaped porous body and cutting the block-shaped porous body into a sheet having a predetermined thickness to prepare a porous sheet.

According to the method described above, ultrahigh-molecular-weight polyethylene is used as the material of the porous sheet, and thus the resulting porous sheet is excellent in abrasion resistance and impact resistance with a low coefficient of friction. In addition, ultrahigh-molecular-weight polyethylene is inexpensive and can thus reduce the production coast. Further, a block-shaped porous body made of ultrahigh-molecular-weight polyethylene is cut to prepare the porous sheet, and thus a continuous sheet for suction and fixation can be successively produced. In cutting, the thickness of the sheet can be arbitrarily changed, and thus a heavy-gauge sheet for suction and fixation having a thickness greater than 1 mm for example can also be produced.

Effects of the Invention

The present invention exhibits the following effects by the means described above.

That is, the sheet for suction and fixation according to the present invention is excellent in surface smoothness with a particle layer having a surface roughness (Ra) of 0.5 μm or less and can, even if a member to be sucked is flexible, prevent the surface profile of the particle layer from transferring to the sucked surface of the member to be sucked. As a result, the product yield can also be improved. The sheet is provided with a particle layer constituted by including plastic particles, is thus excellent in releasability and can, even if a member to be sucked is very thin, prevent the member from being broken or damaged upon releasing.

The method of producing the sheet for suction and fixation according to the present invention involves forming a particle layer constituted by including plastic particles on a porous sheet and can thus provide a sheet for suction and fixation, which is superior in strength, surface smoothness and releasability to conventional sheets for suction and fixation. When ultrahigh-molecular-weight polyethylene is used as the material of the porous sheet, a block-shaped porous body made of the ultrahigh-molecular-weight polyethylene is cut to prepare the porous sheet, and thus a continuous sheet for suction and fixation can be successively produced. In cutting, the thickness of the sheet can be arbitrarily changed, and thus a heavy-gauge sheet for suction and fixation can also be produced.

BEST MODE FOR CARRYING OUT THE INVENTION

Figure 1:
FIG. 1 is a schematic sectional view illustrating the sheet for suction and fixation according to one embodiment of the invention.

Embodiments of the present invention are described by reference to the drawing. However, a part unnecessary for the description is omitted and there are parts illustrated by enlargement or reduction to facilitate the description.

First, the sheet for suction and fixation according this embodiment is described by reference to FIG. 1. As shown in the figure, the sheet for suction and fixation according to the present invention is used for suction and fixation of a member to be sucked and is constituted by including at least a suction fixation sheet 11 having a particle layer 13 arranged on a porous sheet 12.

The porous sheet 12 is a sheet consisting for example of a plastic porous body made of plastics.

The plastics are not particularly limited, and a wide variety of conventionally known plastics can be used. Specific examples include plastics consisting of polymer materials such as polystyrene, ultrahigh-molecular-weight polyethylene (referred to hereinafter as "UHMWPE"), polypropylene, polystyrene, polyamide, polyester, polyacryl, fluorine resin (polytetrafluoroethylene etc.), butadiene rubber, styrene butadiene rubber, isoprene rubber, nitrile rubber etc.

Among these parties, UHMWPE is suitable in the present invention. This is because the porous sheet 12, when composed of UHMWPE, has a low coefficient of friction, is excellent in abrasion resistance and impact resistance and is inexpensive. The molecular weight of UHMWPE is preferably 500,000 or more, more preferably 1,000,000 or more, from the viewpoint of abrasion resistance. Specific examples of UHMWPE include, for example, commercial products Highzex Million® (manufactured by Mitsui Chemicals, Inc.), Hostalen GUR® (manufactured by Ticona), etc. The molecular weight refers to a molecular weight determined according to ASTMD-4020 (viscosity method).

When the porous sheet 12 is composed of UHMWPE, the thickness of the porous sheet 12 can be suitably determined according to applications and is preferably in the range of 0.1 mm to 3.0 mm. When the thickness is less than 0.1 mm, the suction fixation sheet 11 is rendered poor in mechanical strength and broken at use in some cases, and the operativeness of fixing the suction fixation sheet 11 onto a laminating jig etc. may be lowered. On the other hand, when the thickness is greater than 3.0 mm, the air permeability of the porous sheet 12 is lowered.

When the porous sheet 12 is composed of UHMWPE, the porosity of the porous sheet 12 can be determined suitably depending on applications and is preferably in the range of 10 to 70%. When the porosity is less than 10%, there is a tendency for the air permeability to be lowered and for the coefficient of friction to be increased. On the other hand, when the porosity is greater than 70%, the mechanical strength of the porous sheet 12 is lowered. The porosity is calculated according to the following equation (1):

$$\text{Porosity (\%)} = \{1 - (\text{apparent density/true specific gravity of UHMWPE})\} \times 100 \qquad (1)$$

The suction fixation sheet 11 according to the present invention may be impregnated with an antistatic agent such as a surfactant or an electroconductive polymer in order to prevent electrification. Alternatively, carbon black or an electro-conductive polymer is mixed at the time of molding to give antistatic properties. Alternatively, the sheet after cutting may be impregnated with an antistatic agent. Sparking resulting from electrification of the porous sheet 12 can be prevented in a step of dicing a semiconductor wafer, and thus wafer damage attributable to sparking can be prevented. Further, the adhesion of dust to products to be processed such as semiconductor wafers can also be prevented.

The particle layer 13 is a layer constituted by including plastic particles. There are sites where adjacent plastic particles are fused together (sintered) in their contacting portions. The particle layer 13 is at the suction side for sucking and fixing a semiconductor wafer or the like.

The surface roughness (Ra) of the particle layer 13 is preferably 0.5 μm or less, ore preferably in the range of 0.1 to 0.4 μm. When the surface roughness is greater than 0.5 μm, the surface is made rough and may, if a member to be sucked is extremely thin, cause damage to the member to be sucked. When the surface roughness is less than 0.1 μm, the surface is made smooth and may deteriorate releasability in releasing a member to be sucked. When the surface roughness (Ra) is 0.5 μm or less, the particle layer 13 can prevent a member to be sucked from slipping into pores of the layer 13 even if the member to be sucked has low rigidity and is as very thin as a green sheet for laminated ceramic capacitor. As a result, the layer for suction and fixation can prevent the thin member to be sucked from having defects such as unevenness and damage and can also improve operativeness.

The particle layer 13 is a layer constituted by including plastic particles, thus fixing a member to be sucked by bringing the particle layer into contact with the member not through surface contact but through multipoint contact. The particle layer 13 is thereby made excellent in releasability and can, even if a member to be sucked is extremely thin, prevent the member from being broken or damaged upon releasing. In addition, the time required for suction and release of the member to be sucked, that is, the tact time in the production process, can be reduced.

The material constituting the plastic particles can be selected suitably depending on applications etc. For example, when the production process described later is used, the plastic particles are preferably thermoplastic particles. From the viewpoint of surface roughness and strength, the plastic particles are preferably polyethylene, polypropylene or the like. Among the exemplary compounds, ultrahigh-molecular-weight polyethylene is particularly preferable.

The average particle diameter of the plastic particles can be determined suitably depending on applications etc. For reducing surface roughness, however, the average particle diameter is preferably 100 μm or less, more preferably 30 μm or less. The surface roughness of the suction fixation sheet 11 can thereby be improved. Upon suction and fixation of a member to be sucked, the sheet for suction and fixation can thereby prevent the surface profile of the particle layer 13 from transferring to the member to be sucked even if the member is highly flexible. When the average particle diameter is 1 μm or less, however, the particle layer 13 may be rendered non-porous upon formation. Heating temperatures in formation of the particle layer 13 should also be regulated for preventing it from becoming non-porous, thus resulting in a complicated process. The average particle diameter of the plastic particles is preferably uniform. This is because the thickness and pore diameter of the particle layer 13 can be made uniform. The average particle diameter is a value measured by a coulter counter system.

The particle shape of the plastic particles can be determined suitably depending on applications etc. For example, when the plastic particles are spherical or roughly spherical, the particle layer 13 has a structure in which plastic particles are arranged in plane, and thus contacts with the member to be sucked not through surface contact but through multipoint contact. As a result, the contact area can be reduced to provide the suction and fixation sheet with a very small coefficient of friction. The particles may be not only spherical or roughly spherical but also potato- or grape-shaped. The particle shape of the plastic particles is preferably uniform. This is because the thickness and pore diameter of the particle layer 13 can be made uniform.

The thickness of the particle layer 13 can be suitably determined according to applications etc., and is preferably in the range of 10 mm to 50 mm, more preferably in the range of 20 mm to 200 mm.

The releaseability of the suction fixation sheet 11 according to this embodiment is preferably as high as possible in order to release the sucked and fixed member after delivery. When this releasability is evaluated in terms of adhesion to a general pressure-sensitive adhesive tape (No. 31, manufactured by Nitto Denko Corporation), the adhesion of the sheet is preferably lower because the lower adhesion is indicative of higher releasability. Specifically, the adhesion is preferably not higher than 2.0 N/19 mm, more preferably not higher than 1.5 N/19 mm. When the adhesion is higher than 2.0 N/19 mm, the sucked member may remain on the surface of the particle layer 13 upon release of a dielectric sheet, to cause inconvenience in releasing. This adhesion tends to be decreased as the surface roughness is increased. It follows that when the adhesion is too low, the surface roughness is too high, thus causing damage to the sucked member to be sucked upon suction and fixation. From this point of view, the adhesion is preferably not lower than 0.3 N/19 mm.

The air permeability of the suction fixation sheet 11 according to this embodiment is preferably higher from the viewpoint of the problem of tact time for suction of the member to be sucked. Specifically, the air permeability determined by a Fragile testing machine is preferably not lower than 0.3 $cm^3/cm^2 \cdot sec$, more preferably not lower than 1.0 $cm^3/cm^2 \cdot sec$. When the air permeability is decreased, the tact time necessary for suction and fixation of a member to be sucked may be increased to lower productivity as described above.

The sheet for suction and fixation according to the present invention may be the suction fixation sheet 11 alone or may be a laminate having a plurality of laminated layers as other porous sheets different in pore diameter, strength, air permeability, etc. In this case, other porous sheet(s) is laminated at an opposite side to the suction side (that is, the particle layer 13) of the suction fixation sheet 11. Other porous sheet(s) when laminated on the suction fixation sheet 11 can confer sufficient strength in addition to surface smoothness for suction and fixation for delivery.

Now, the method of producing the sheet for suction and fixation according to this embodiment is described.

The method of producing the sheet for suction and fixation according to the present invention comprises the steps consisting of preparing a porous sheet, preparing a dispersion having plastic particles dispersed in a solvent, applying the dispersion onto a film to form a coating layer thereon, arranging the porous sheet on the coating layer, sintering the coating layer, and removing the solvent contained in the coating layer. Hereinafter, the present invention is described by reference to the method using UHMWPE.

A wide variety of known methods can be used for preparation of the porous sheet 12 consisting of UHMWPE. Specifically, an extraction method, a sintering method (JP-B 5-66855) etc. can be mentioned.

For example, the sintering method is carried out in the following manner. That is, UHMWPE powder (usually having a particle diameter of 30 to 200 μm) is filled in a mold and then sintered in an atmosphere of water vapor heated to a temperature not lower than the melting point of UHMWPE, to form a block-shaped porous body. UHMWPE powder is thus filled in a mold and sintered in an atmosphere of heated water vapor, and therefore a mold having at least one opening (for introduction of heated water vapor) is used. The time necessary for sintering varies depending on the amount of the powder filled, the temperature of the water vapor, etc., and is usually about 1 to 12 hours.

The water vapor used herein is in a state pressurized for attaining a temperature not lower than the melting point of UHMWPE and can thus easily penetrate into UHMWPE powder filled in a mold. For facilitating penetration of heated water vapor into UHMWPE powder, the powder is filled in a mold and this mold is placed in a pressure-resistant container and then rendered depressurized by degassing, which may be followed by sintering in an atmosphere of heated water vapor. The degree of depressurization is not particularly limited, but is preferably about 0.13 to 13 kPa.

Accordingly, the UHMWPE powder filled in the mold can be sintered by a method wherein the pressure-resistant container is provided with a water vapor-introducing tube and an opening/closing valve for the introducing tube, the powder is degassed, and after degassing is stopped or while degassing is continued, the water vapor valve is opened to introduce heated water vapor.

At the time of this sintering, UHMWPE powder is heated to a temperature not lower than its melting point, but does not significantly fluidize because of the high viscosity of its melt, and while the shape of the powder is partially or wholly maintained, the adjacent powders are thermally fused mutually in their contacting sites to form a block-shaped porous body (portions where the powders are not contacted with one another serve as pores of the porous molded body). In sintering, the powders may be pressurized if desired where the pressure is usually preferably about 1 MPa or less.

The porous body is sintered in this manner and then cooled. For cooling, rapid cooling is preferably avoided in order to prevent the block-shaped porous body from undergoing cracking. The method of cooling may be for example a method of leaving it at room temperature. The block-shaped porous body may be cooled in a mold or after removal from a mold. After the block-shaped porous body is cooled, the block-shaped porous body is cut in predetermined thickness with a lathe or the like. The porous sheet 12 can thereby be obtained.

The pore diameter and porosity of the porous sheet 12 obtained by the method described above are determined on the basis of the particle diameter of UHMWPE powder used and the presence or absence of pressurization at the time of sintering. When the conditions are fixed, the porous sheet 12 has a higher pore diameter and higher porosity as the particle diameter of the powder used is increased. The porous sheet 12 has a greater pore diameter and higher porosity where the powder has not been pressurized in sintering than where the powder has been pressurized. When the powder has been pressurized in sintering, the higher the pressure, the porous sheet 12 has a smaller pore diameter and lower porosity.

The porous sheet 12 made of UHMWPE obtained in this manner has a microstructure wherein as described above, the adjacent UHMWPE powders maintain their shape partially or wholly and are thermally fused mutually at their contacting sites to form a sheet, while the sites where the powders are not contacted with one another serve as pores. The microstructure of this porous sheet can be observed by cutting the porous sheet 12 along the direction of thickness and then observing the resulting section under a scanning electron microscope (magnification can be suitably established and is usually about ×100 to ×1000).

Then, the method of forming the particle layer 13 is described. First, plastic particles meeting the object are dispersed in an arbitrary solvent. The solvent is not particularly limited and a conventionally known solvent can be used. It is however preferable to employ a solvent having a boiling point not lower than the sintering temperature (described later) of the plastic particles. From this point of view, the solvent can be specifically exemplified by, for example, glycerin, ethylene glycol, polyethylene glycol, etc.

The mixing ratio of the plastic particles to the solvent is not particularly limited, and the ratio of the solvent to the plastic particles is preferably in the range of about 0.5 to 10 (ratio by volume), more preferably in the range of 1 to 3.

A dispersing aid such as a surfactant, or a defoaming agent, can be added to the dispersion. By so doing, the dispersibility of the plastic particles can be improved or the dispersion can be prevented from generating bubbles upon application onto a film described later.

Then, the dispersion is supplied onto a film. This application can be carried out by a general method used for applying a viscous material. The thickness of a coating layer can be suitably established depending on the application object and on the size of the plastic particles contained in the dispersion. However, the thickness of the coating layer after sintering is preferably in the range of about 10 to 500 μm, more preferably in the range of about 20 to 200 μm. When the thickness is less than 10 μm, in-plane arrangement of the plastic particles is made difficult in some cases. On the other hand, when the thickness is greater than 500 μm, the air permeability may be lowered.

The film is preferably excellent in heat resistance and surface smoothness. When the film is selected from the viewpoint of heat resistance, the film may be suitably selected depending on the material of the plastic particles. For example, when the material of the plastic particles is UHMWPE or polypropylene particles, the film is preferably polyethylene terephthalate, polyimide or the like. This is because a film made of such material has sufficient heat resistance and a generally smooth surface. When the film is selected from the viewpoint of surface smoothness, the film can give excellent smoothness upon planarization of the sites at which the plastic particles contact with a support. It follows that upon suction and fixation of a member to be sucked, the adhesion of the sheet to the member to be sucked is improved.

The surface of the film may be subjected to hydrophilization treatment for improving affinity for the dispersion. The hydrophilization treatment can be exemplified by corona treatment, plasma treatment, hydrophilic monomer grafting treatment, etc.

Then, the porous sheet 12 is laminated on the coating layer formed on the film. The lamination method may involve merely placing the porous sheet 12 on the coating layer. If necessary, the resulting laminate may be nipped by passing it through a pair of rolls. By nipping, the plastic particles on the surface layer (site contacting with a member to be sucked) of the particle layer 13 formed can be flattened. As a result, the adhesion to the member to be sucked can be improved for suction and fixation of the member to be sucked.

The porous sheet 12 may be used as it is, or may be impregnated with a solvent used in the dispersion. Further, the film may also be arranged at the backside (opposite side to the side contacting with the coating layer) of the porous sheet 12. By impregnating the porous sheet 12 with a solvent or arranging the film at the backside of the porous sheet 12, the solvent can be prevented from evaporating upon molding.

Then, the suction and fixation sheet constituted by arranging the porous sheet 12 on the coating layer is heated to a predetermined temperature. The contact points between the plastic particles are thereby fused (sintered). For example, when UHMWPE is used as the material of the porous sheet 12, the heating temperature is preferably in the range of 130 to 200° C., more preferably in the range of 140 to 180° C. When polypropylene is used, the heating temperature is preferably in the range of 150 to 220° C., more preferably in the range of 170 to 200° C.

After sintering, the powder is cooled. After the film is removed, the solvent contained in the coating layer is evaporated at high temperatures. Alternatively, the solvent can be extracted with another solvent followed by drying to give the objective suction fixation sheet 11. Solvent extraction may be selected suitably depending on the type of the solvent contained in the coating layer. In solvent extraction, the sheet may be humidified or vibrated for example by sonication thereby achieving efficient extraction of the solvent.

EXAMPLES

Hereinafter, the invention is described in more detail by reference to the preferable embodiments of the invention. However, the materials, the amounts of the materials, etc. described in the Examples are merely illustrative of the invention unless otherwise specified, and are not intended to limit the scope of the invention.

Example 1

UHMWPE powder (molecular weight of 9,000,000, melting point of 135° C., average particle diameter of 110 μm) was filled in a mold having an inner diameter of 500 mm and a height of 1000 mm, then placed in a metallic pressure-resistant container and depressurized to $4 \times 10^3$ Pa in the container.

Thereafter, heated water vapor was introduced into the container which was then heated at 160° C. at 6 atmospheric pressures for 5 hours and then gradually cooled to prepare a cylindrical sintered porous body (block-shaped porous body). This sintered porous body was cut by a lathe into a sheet having a thickness of 1.0 mm, whereby a porous sheet made of UHMWPE was obtained.

Then, UHMWPE powder different in particle diameter (average molecular weight of 2,000,000, melting point of 135° C.; average particle diameter of 30 μm; particle shape of spherical) was mixed with glycerin and a surfactant to prepare a dispersion. The solid content of the dispersion was adjusted to 40% by volume. Subsequently, this dispersion was applied via an applicator onto a polyimide film (Capton 100H) having a surface subjected previously to corona treatment. The thickness of the coating layer (including the solvent) was 100 μm.

Just after formation of the coating layer, the above porous sheet was arranged on the coating layer. A polyimide film was further arranged on the backside of the porous sheet. This laminate was introduced into a drying machine set at 150° C. and then left for 30 minutes. Thereafter, the laminate was removed and cooled naturally to room temperature. Then, the front and back polyimide films were released respectively and the sheet was dipped in ethyl alcohol to extract the dispersing solvent. For efficient extraction of the dispersing solvent, the sheet was vibrated by sonication. Thereafter, the ethyl alcohol was evaporated at room temperature, whereby the sheet for suction and fixation in Example 1 was obtained.

Example 2

A porous sheet was prepared in the same manner as in Example 1.

Then, polypropylene resin was ground by a grinder and classified (280-mesh pass) thorough a screen to give polypropylene powder (melting point 170° C., average particle diameter 50 μm, amorphous).

Then, the polypropylene powder was mixed with glycerin and a surfactant to prepare a dispersion. The solid content of the dispersion was adjusted to 40% by volume.

This dispersion was applied via an applicator onto a polyimide film (Capton 100H) having a surface subjected previously to corona treatment. The thickness of the coating layer (including the solvent) was 100 μm.

Just after formation of the coating layer, the above porous sheet was arranged on the coating layer. A polyimide film was further arranged on the backside of the porous sheet. This laminate was introduced into a drying machine set at 170° C. and then left for 30 minutes. Thereafter, the laminate was removed and cooled naturally to room temperature. Then, the front and back polyimide films were released respectively and the sheet was dipped in ethyl alcohol to extract the dispersing solvent. For efficient extraction of the dispersing solvent, the sheet was vibrated by sonication. Thereafter, the ethyl alcohol was evaporated at room temperature, whereby the sheet for suction and fixation in Example 2 was obtained.

Comparative Example 1

UHMWPE powder (molecular weight of 2,000,000, melting point of 135° C., average particle diameter of 30 μm, spherical) was mixed with a surfactant and deionized water to prepare a dispersion. The solid content of the dispersion was adjusted to 40% by volume. This dispersion was applied via an applicator onto a polyimide film (Capton 100H) having a surface subjected previously to corona treatment. The thickness of the coating layer (including the solvent) was 100 μm.

The coating layer was introduced as such into a drying machine set at 150° C. and left for 30 minutes. Thereafter, the polyimide film was removed and cooled naturally to room temperature. Then, the polyimide film was dipped in ethyl alcohol to extract the dispersing solvent. Thereafter, the ethyl alcohol was evaporated at room temperature, whereby the sheet for suction and fixation in Comparative Example 1 was obtained.

Comparative Example 2

A PET film having a thickness of 0.25 mm (Lumillar S10, manufactured by Toray Industries, Inc.) was laminated on the top surface of the UHMWPE porous sheet used in Example 1, and the resulting laminate was pressed with a pressing machine. The pressing conditions were as follows: heating at a temperature of 140° C. at a pressure of $5 \times 10^3$ Pa for 3 hours. Thereafter, the porous sheet was cooled in the pressed state to prepare the sheet for suction and fixation having a smoothed surface in Comparative Example 2.

(Various Measurements and Evaluation)

Each of the various sheets for suction and fixation prepared above was measured for its surface roughness and tensile strength. These results are shown in Table 1 below. The measurement methods and measurement conditions are as follows:

[Surface Roughness]

The surface roughness of the sheet for suction and fixation was measured by using a tracer-type surface roughness meter (Surfcom 550A, manufactured by Tokyo Seimitsu Co., Ltd.). The measurement conditions were as follows: the tip diameter R was 250 μm, the rate was 0.3 mm/sec., and the measurement length was 4 mm.

[Tensile Strength]

The tensile strength was measured by using a tensile testing machine (Autograph AG-I, manufactured by Shimadzu Corporation). The measurement conditions were as follows: the sample width was 10 mm and the tensile rate was 200 mm/min.

[Thickness]

The thickness of each sheet for suction and fixation was measured by using a 1/1000 micrometer.

[Air Permeability]

The air permeability of each sheet for suction and fixation was measured by using a Fragile testing machine. The air permeability is air permeability in the direction of thickness of the whole of the sheet for suction and fixation.

[Adhesion]

The adhesion was measured by using a tensile testing machine (Autograph AG-1, manufactured by Shimadzu Corporation). The measurement conditions were as follows: a pressure-sensitive adhesive tape (No. 31B, 19 mm width, manufactured by Nitto Denko Corporation) was tuck to the sheet by moving a 20-N roller once back and forth, and the sheet was left at room temperature for 5 minutes and then released from the adhesive tape at a release angle of 180° at a release rate of 300 mm/min.

TABLE 1

|  | Surface Roughness Ra (μm) | Tensile strength (MPa) | Thickness (mm) | Air permeability (cm³/cm²·sec) | Adhesion (N/19 mm) |
| --- | --- | --- | --- | --- | --- |
| Example 1 | 0.3 | 9 | 1.02 | 1.8 | 1.2 |
| Example 2 | 0.4 | 10 | 1.03 | 2.0 | 0.9 |
| Comparative Example 1 | 0.2 | 0.2 | 0.05 | 4.0 | 1.1 |
| Comparative Example 2 | 1.2 | 8 | 0.98 | 2.1 | 0.2 |

As is evident from Table 1, the sheet for suction and fixation in each of Examples 1 and 2 is constituted by forming a particle layer on a UHMWPE porous sheet serving as a base layer, thereby exhibiting excellent tensile strength. It was also confirmed that the surface roughness (Ra) shows a lower value indicative of excellent surface smoothness. On the other hand, the sheet for suction and fixation in Comparative Example 1 had a smooth surface but was poor in tensile strength. Given the production method in Comparative Example 1, thinning of the sheet for suction and fixation was difficult. It was confirmed that the sheet for suction and fixation in Comparative Example 2 is excellent in tensile strength but inferior in surface smoothness with great surface roughness (Ra).

The invention claimed is:

1. A sheet for suction and fixation constituted by including at least a porous sheet and used for suction and fixation of a member to be sucked, wherein at least one side of the porous sheet is provided with a particle layer constituted by including plastic particles, and a surface roughness (Ra) of the particle layer is not greater than 0.5 μm, and wherein the porous sheet comprises a sintered body containing ultrahigh-molecular-weight polyethylene.

2. The sheet for suction and fixation according to claim 1, wherein a thickness of the porous sheet is from 0.1 mm to 3.0 mm.

3. The sheet for suction and fixation according to claim 1, wherein a porosity of the porous sheet is from 10% to 70%.

4. The sheet for suction and fixation according to claim 1, wherein the sheet further comprises an antistatic agent impregnated therein.

5. The sheet for suction and fixation according to claim 1, wherein the Ra is 0.1 μm to 0.4 μm.

6. The sheet for suction and fixation according to claim 1, wherein a thickness of the particle layer is from 10 μm to 500 μm.

7. The sheet for suction and fixation according to claim 1, wherein an adhesion of the sheet for suction and fixation is from 2.0 N/19 mm to 0.3 N/19 mm.

8. The sheet for suction and fixation according to claim 1, wherein an air permeability of the sheet for suction and fixation is from 0.3 cm³/cm²·sec to 1.0 cm³/cm²·sec.

\* \* \* \* \*

UNITED STATES PATENT AND TRADEMARK OFFICE
CERTIFICATE OF CORRECTION

| | | |
|---|---|---|
| PATENT NO. | : 7,851,058 B2 | Page 1 of 1 |
| APPLICATION NO. | : 11/632181 | |
| DATED | : December 14, 2010 | |
| INVENTOR(S) | : Hiroyuki Iida et al. | |

It is certified that error appears in the above-identified patent and that said Letters Patent is hereby corrected as shown below:

Column 1, line 44; delete "unable" and insert --usable--, therefor.

Column 2, line 67; delete "releaseability" and insert --releasability--, therefor.

Column 3, line 19; delete "constituting" and inset --consisting--, therefor.

Column 3, line 31; delete "coast." and insert --cost.--, therefor.

Column 4, line 31; delete "parties," and insert --plastics,--, therefor.

Column 4, line 42; delete "ASTMD-4020" and insert --ASTMD4020--, therefor.

Column 5, line 60; delete "temperatures" and insert --temperature--, therefor.

Column 6, line 18; delete "releaseability" and insert --releasability--, therefor.

Column 8, line 28; delete "supplied" and insert --applied--, therefore.

Column 10, line 55; delete "(Lumillar S10," and insert --(Lumilar S10,--, therefor.

Column 11, line 33; delete "tuck" and insert --stuck--, therefor.

Signed and Sealed this
First Day of November, 2011

David J. Kappos
*Director of the United States Patent and Trademark Office*